US012628276B2

(12) United States Patent
Choi et al.

(10) Patent No.: US 12,628,276 B2
(45) Date of Patent: May 12, 2026

(54) INTEGRAL ELECTRONIC STACK

(71) Applicant: 3M INNOVATIVE PROPERTIES COMPANY, St. Paul, MN (US)

(72) Inventors: Jeongwan Choi, Suwon-Si (KR); Jong-Pil Kim, Gyeonggi-do (KR); Jinbae Kim, Ansan (KR); Jeffrey W. McCutcheon, Baldwin, WI (US)

(73) Assignee: 3M Innovative Properties Company, St. Paul, MN (US)

( * ) Notice: Subject to any disclaimer, the term of this patent is extended or adjusted under 35 U.S.C. 154(b) by 222 days.

(21) Appl. No.: 18/698,113

(22) PCT Filed: Oct. 5, 2022

(86) PCT No.: PCT/IB2022/059512
§ 371 (c)(1),
(2) Date: Apr. 3, 2024

(87) PCT Pub. No.: WO2023/062484
PCT Pub. Date: Apr. 20, 2023

(65) Prior Publication Data
US 2024/0414845 A1     Dec. 12, 2024

(30) Foreign Application Priority Data

Oct. 14, 2021     (KR) ......................... 10-2021-0136941

(51) Int. Cl.
*H05K 1/14*          (2006.01)
*H05K 3/46*          (2006.01)
(52) U.S. Cl.
CPC ........... *H05K 1/144* (2013.01); *H05K 3/4611* (2013.01)
(58) Field of Classification Search
CPC .............................. H05K 1/144; H05K 3/4611
(Continued)

(56) References Cited

U.S. PATENT DOCUMENTS

| | | | | |
|---|---|---|---|---|
| 10,154,594 B2 * | 12/2018 | Lee | ...................... | H05K 3/4046 |
| 2014/0205851 A1 | 7/2014 | Mahajan et al. | | |
| 2021/0313499 A1 * | 10/2021 | Gasse | ...................... | H10F 30/21 |

FOREIGN PATENT DOCUMENTS

| | | |
|---|---|---|
| CN | 209897343 U | 1/2020 |
| JP | 2017191955 A | 10/2017 |

(Continued)

OTHER PUBLICATIONS

International Search report for PCT International Application No. PCT/IB2022/059512, mailed on Jan. 13, 2023, 3 pages.

*Primary Examiner* — Andargie M Aychillhum
(74) *Attorney, Agent, or Firm* — Gregg H. Rosenblatt

(57)          ABSTRACT

The disclosure relates to an integral electronic stack and a multi-layer stack. Specifically, according to an embodiment of the disclosure, there is provided an integral electronic stack for grounding an electrically conductive component in which passive intermodulation (PIM) is reduced, wherein the integral electronic stack includes a first integral stack and a second integral stack, the first integral stack being bonded to the second integral stack, wherein the first integral stack includes: a first board which is substantially rigid; a first electrically conductive layer which is disposed on at least part of a first main surface of the first board; a first electrically conductive adhesive layer and a second electrically conductive adhesive layer; and a first electrically conductive film which is disposed between the first electrically conductive adhesive layer and the second electrically conductive adhesive layer, and is bonded to the first electrically conductive adhesive layer and the second electrically conductive adhesive layer, respectively, the first electrically conductive adhesive layer and the second electrically conductive adhesive layer including a plurality of electrically conductive elements substantially distributed in an electrically insulative material, wherein the first electrically con- (Continued)

ductive adhesive layer bonds the first electrically conductive film to the one or more first electrically conductive layer.

10 Claims, 6 Drawing Sheets

(58) Field of Classification Search
USPC ......................................................... 361/784
See application file for complete search history.

(56) References Cited

FOREIGN PATENT DOCUMENTS

| | | | |
|---|---|---|---|
| JP | 2018041953 | A | 3/2018 |
| KR | 20110026436 | A | 3/2011 |
| WO | 2021004177 | A1 | 1/2021 |

\* cited by examiner

INTEGRAL ELECTRONIC STACK

CROSS REFERENCE TO RELATED APPLICATIONS

This application is a national stage filing under 35 U.S.C. 371 of PCT/IB2022/059512, filed Oct. 5, 2022, which claims the benefit of Korea Application No. 10-2021-0136941, filed Oct. 14, 2021, the disclosures of which are incorporated by reference in their entireties herein.

TECHNICAL FIELD

The disclosure relates to an integral electronic stack.

BACKGROUND

Recently, technology for mobile communication is being actively developed, and important factors for development of mobile communication are increasing a service capacity and enhancing communication quality. The increasing of the service capacity and the enhancement of the communication quality may be accompanied by a problem of inter-channel interference, and intermodulation distortion (IMD) may be an important factor of the interference problem.

When two or more signal frequencies interfere with each other, an unexpected parasitic signal may be generated. For example, a phenomenon in which signal frequencies interfere with each other and a parasitic signal is generated in a passive element is referred to as passive intermodulation (PIM).

Such passive intermodulation (PIM) occurs not only in a filter but also in most of passive elements having metal-to-metal contact, such as an antenna, a cable, a connector, a switch, or the like. In addition, the passive intermodulation (PIM) may occur due to loose mechanical bonding, oxidation on a bonding portion between ferrous-based metals, contamination on a surface of a conductor on RF welding, nonlinearity characteristics like hysteresis of a ferromagnetic material, or the like.

SUMMARY

Technical Problem

The passive intermodulation (PIM) phenomenon mostly occurs in a process of communicating data at high speed in a communication device, etc. However, when the passive intermodulation occurs, it may influence interference between an uplink channel signal and a downlink channel signal, causing problems that a communication service radius is reduced and telephone connection efficiency is abruptly reduced. To this end, communication quality may deteriorate and inconvenience of a user may be caused.

An embodiment of the disclosure has been developed based on the above-described background, and is to provide an electrically conductive circuit board in which passive intermodulation (PIM) caused by a plurality of signals is reduced.

Technical Solution

According to an aspect of the disclosure, there is provided an integral electronic stack for grounding an electrically conductive component in which passive intermodulation (PIM) is reduced, wherein the integral electronic stack includes a first integral stack and a second integral stack, the first integral stack being bonded to the second integral stack, wherein the first integral stack includes: a first board which is substantially rigid: a first electrically conductive layer which is disposed on at least part of a first main surface of the first board: a first electrically conductive adhesive layer and a second electrically conductive adhesive layer; and a first electrically conductive film which is disposed between the first electrically conductive adhesive layer and the second electrically conductive adhesive layer, and is bonded to the first electrically conductive adhesive layer and the second electrically conductive adhesive layer, respectively, the first electrically conductive adhesive layer and the second electrically conductive adhesive layer including a plurality of electrically conductive elements substantially distributed in an electrically insulative material, wherein the first electrically conductive adhesive layer bonds the first electrically conductive film to the one or more first electrically conductive layers, wherein the second integral stack includes: an electrically conductive second board which is substantially rigid: a third electrically conductive adhesive layer which includes a plurality of electrically conductive elements substantially distributed in an electrically insulative material; and a flexible metal film which is bonded to at least part of a first main surface of the second board through the third electrically conducive adhesive layer, wherein the first integral stack and the second integral stack are bonded to each other by the second electrically conductive adhesive layer which is bonded to the flexible metal film disposed opposite the third electrically conductive adhesive layer, and electrically connect the first electrically conductive layer to the second board.

In addition, there is provided an integral electronic stack including: a first electrically conductive adhesive layer, a second electrically conductive adhesive layer, a third electrically conductive adhesive layer: a flexible metal film which is disposed between the first electrically conductive adhesive layer and the second electrically conductive adhesive layer, and is bonded to the first electrically conductive adhesive layer and the second electrically conductive adhesive layer; and a second electrically conductive film which is disposed between the second electrically conductive adhesive layer and the third electrically conductive adhesive layer, and is bonded to the second electrically conductive adhesive layer and the third electrically conductive adhesive layer, wherein each of the first to third electrically conductive adhesive layers includes a plurality of electrically conductive elements substantially distributed in an electrically insulative material, wherein, when a conductive circuit is provided by the steps of: providing a first gold microstrip and a second gold microstrip which are spaced apart from each other: arranging a same stainless steel plate on the first gold microstrip and the second gold microstrip; and arranging a multi-layer stack and a multi-layer stack which is substantially similar to the multi-layer stack between the stainless steel plate and the first gold microstrip, and the second gold microstrip, such that the first electrically conductive adhesive layers of the two multi-layer stacks are bonded to the same surface of the stainless steel plate, and the third electrically conductive adhesive layers of the two multi-layer stacks are bonded to the first gold microstrip and the second gold microstrip, respectively, if a first current signal and a second current signal which have strengths I1 and I2, respectively, which are substantially the same, and frequencies F1 and F2 which are different, are applied to the first gold microstrip, simultaneously, an intermodulation current signal that has a same frequency F3 as nF1+mF2 (m and n are positive or negative integers, not 0) is reflected by an electrical signal of strength I3, $-150 \leq I3/I1 \leq -30$ dB.

Advantageous Effects

In an embodiment of the disclosure, there is an effect that passive intermodulation (PIM) caused by a plurality of signals is reduced.

DETAILED DESCRIPTION

Hereinafter, specific embodiments for implementing the technical concept of the disclosure will be described in detail with reference to the accompanying drawings.

In the description of the disclosure, detailed explanations of related-art configurations or functions are omitted when it is deemed that they may unnecessarily obscure the essence of the disclosure.

In addition, it should be understood that, when a certain element is referred to as being 'connected to,' or 'in contact with' another element, the certain element may be directly connected to, or in direct contact with another element, but there may be an intervening element therebetween.

The terms used in the detailed descriptions are used for the purpose of describing particular embodiments only and are not intended to limit the disclosure. The singular forms include the plural forms as well unless the context clearly indicates otherwise.

In addition, the terms including ordinal numbers such as 'first' and 'second' may be used to describe various elements, but these elements should not be limited by such terms. These terms are used for the purpose of distinguishing one element from another element only.

The term "includes" used in this specification specifies a specific feature, area, integer, step, operation, element, and/or component, and does not preclude the presence or addition of other specific features, areas, integers, steps, operations, elements, components, and/or groups.

A thickness direction used in this specification may be a y-axis direction of FIGS. 1 to 3 and FIG. 6. In addition, a lateral direction may be an x-axis direction of FIGS. 1 to 3, and FIG. 6.

Hereinafter, a detailed configuration of an integral electronic stack 1 according to an embodiment of the present disclosure will be described with reference to the drawings.

Figure 1:
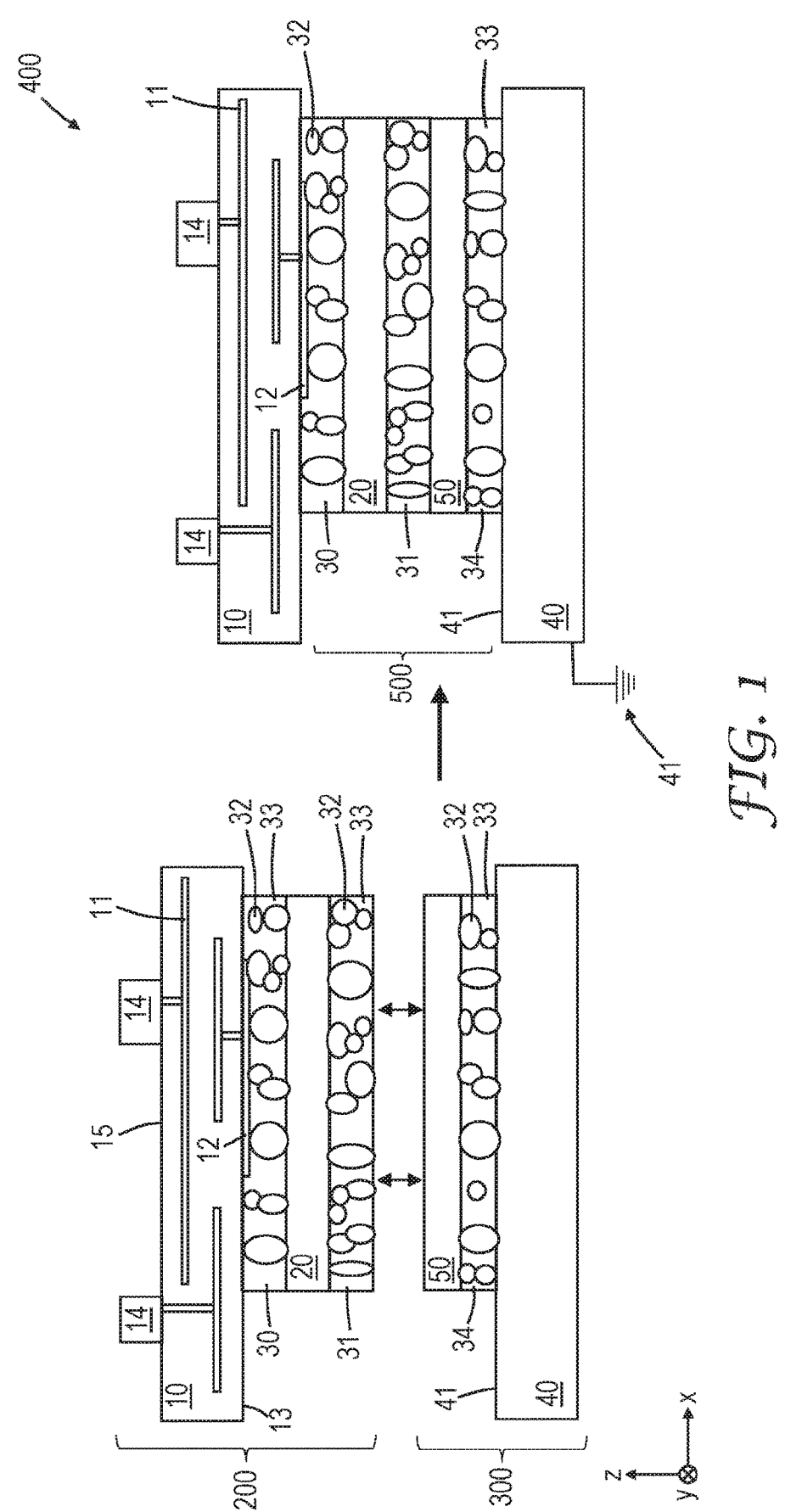
FIG. 1 is a cross-sectional view illustrating a cross section of an integral electronic stack according to a first embodiment of the disclosure.
Figure 2:
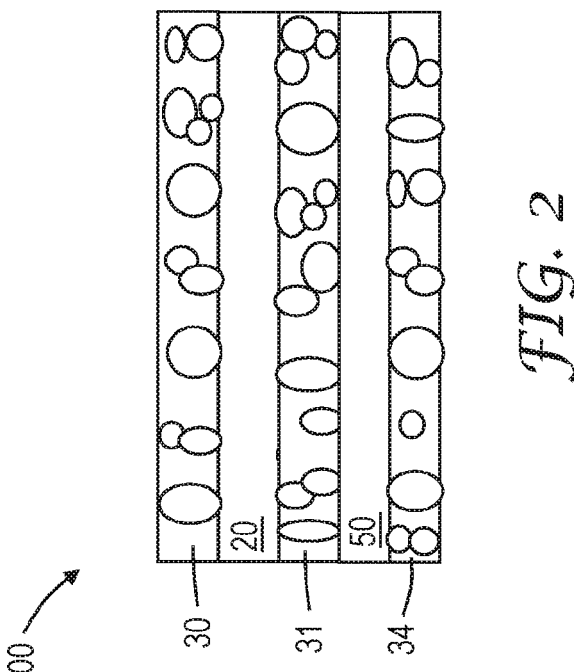
FIG. 2 is a cross-sectional view illustrating a process of manufacturing the integral electronic stack of FIG. 1.

Referring to FIGS. 1 and 2, the integral electronic stack 1 according to an embodiment of the disclosure may provide an electrically grounded circuit board, and may reduce passive intermodulation (PIM) caused by a plurality of current signals. The integral electronic stack 1 described above may include a first integral stack 10 and a second integral stack 20.

The first integral stack 10 may be connected with the second integral stack 20, and may reduce passive intermodulation (PIM) occurring in the second integral stack 20. The first integral stack 10 may include a first board 100, a first electrically conductive layer 200, a first electrically conductive film 300, a first electrically conductive adhesive layer 400, and a second electrically conducive adhesive layer 500.

The first board 100 may provide a circuit through which a current flows. For example, the first board 100 may be a flexible printed circuit board (FPCB). In addition, the first board 100 may have electrical conductivity. The first board 100 may have a first main surface 110 and a second main surface 120 which are opposite to each other in the thickness direction. In addition, the first board 100 may have a predetermined rigidity. For example, bending a first point 101 of the first board 100 over a bend radius of between 1 mm and 10 mm may deform the first board 100 at the first point 101 of the first board 100 irreversibly. The first board 100 may include a first circuit board 130 and an electronic device 140.

The first circuit board 130 may have surfaces which are opposite to each other in the thickness direction. In this specification, the first main surface 110 of the first board 100 may be referred to as a first main surface 110 of the first circuit board 130, and the second main surface 120 of the first board 100 may be referred to as a second main surface 120 of the first circuit board 130. In addition, the first circuit board 130 may include an electrically conductive connector 131.

The electrically conductive connector 131 may include a material having electrical conductivity to allow a current to flow therethrough. In addition, the electrically conductive connector 131 may be connected with one or more of the first main surface 110 and the second main surface 120 of the first board 100, and may be inserted into the inside of the first circuit board 130. For example, the electronic device 140 disposed on the first circuit board 130 may exchange an electrical signal with the electrically conductive connector 131.

A plurality of electrically conductive connectors 131 may be provided, and at least some of the plurality of electrically conductive connectors 131 may be disconnected from each other. In addition, some of the plurality of electrically conductive connectors 131 may be connected with the electronic device 140, and some of the others of the electrically conductive connectors 131 may be connected with the first electrically conductive layer 200.

The first electrically conductive layer 200 may be disposed on at least part of the first main surface 110 of the first board 100. For example, the first electrically conductive layer 200 may be disposed only on a part of the first main surface 110 of the first board 100. In addition, the first electrically conductive layer 200 may be surrounded by the first electrically conductive adhesive layer 400. The first electrically conductive layer 200 may have low passive intermodulation (PIM). For example, the first electrically conductive layer 200 may include one or more of gold (Au), tin (Sn), nickel (Ni), silver (Ag), and silver ink.

The first electrically conductive film 300 may have one surface bonded to the first electrically conductive adhesive layer 400, and the other surface bonded to the second electrically conductive adhesive layer 500. In other words, the first electrically conductive film 300 may be disposed between the first electrically conductive adhesive layer 400 and the second electrically conductive adhesive layer 500. For example, the first electrically conductive film 300 may include one or more of electrically conductive foil and fabric. The electrically conductive foil of the first electrically conductive film 300 may include copper (Cu). In addition, the electrically conductive fabric of the first electrically conductive film 300 may include a plurality of woven electrically conductive fibers, and a plurality of non-woven electrically conductive fibers.

The first electrically conductive adhesive layer 400 may be disposed between the first board 100 and the first electrically conductive film 300, and may connect the first board 100 and the first electrically conductive film 300. In addition, the first electrically conductive adhesive layer 400 may connect the first electrically conductive layer 200 and the first electrically conductive film 300. The first electrically conductive adhesive layer 400 may form a first resistive contact with the first electrically conductive layer 200. Herein, the first resistive contact refers to a resistance that is generated by contact between the first electrically conductive layer 200 and the first electrically conductive adhesive layer 400. For example, a first passive intermodulation signal may be generated by the first resistive contact formed between the first electrically conductive adhesive layer 400 and the first electrically conductive layer 200.

The second electrically conductive adhesive layer 500 may be disposed between the first electrically conductive film 300 and the second integral stack 20, and may connect the first electrically conductive film 300 and the second integral stack 20.

The second integral 20 may be connected with the first integral stack 10. In addition, the second integral stack 20 may be grounded and may ground the first integral stack 10. The second integral stack 20 may include a second board 600, a flexible metal film 700, and a third electrically conductive adhesive layer 800.

The second board 600 may provide a circuit through which a current flows. For example, the second board 600 may be a flexible printed circuit board (FPCB). In addition, the second board 600 may have electrical conductivity. The second board 600 may have a first main surface 610 and a second main surface 620 which are opposite to each other in the thickness direction. Herein, the first main surface 610 and the second main surface 620 of the second board 600 may be surfaces of the second board 600, and may be understood as being distinct from the first main surface 110 and the second main surface 120 of the first board 100.

On the other hand, the second board 600 may be grounded and may ground the first board 100. In other words, the first board 100 may be grounded through the second board 600. For example, the second board 600 may include one or more of stainless steel, aluminum (Al), galvanized aluminum, magnesium (Mg), an alloy of magnesium and aluminum, iron (Fe), zinc (Zn), galvanized steel, titanium (Ti), and zinc plated iron.

A passive intermodulation signal generated in the integral electronic stack 1 may be a passive intermodulation signal generated in any one of the first board 100 and the second board 600. For example, a passive intermodulation signal generated in the integral electronic stack 1 may be mainly caused by a second passive intermodulation signal generated in the second board 600.

In addition, the second board 600 may have a predetermined rigidity. For example, bending a first point 601 of the second board 600 over a bend radius of between 1 mm and 10 mm may deform the second board 600 at the first point 601 of the second board 600 irreversibly.

The flexible metal film 700 may reduce passive intermodulation (PIM) occurring in the second board 600. For example, the flexible metal film 700 may reduce a passive intermodulation signal generated in one or more of the first resistive contact and a second resistive contact, which will be described below, by 3 dB to 80 dB inclusive. The flexible metal film 700 may be bonded to at least part of the first main surface 610 of the second board 600 through the third electrically conductive adhesive layer 800. In addition, the flexible metal film 700 may be bonded to the second electrically conductive adhesive layer 500, and may be electrically connected with the first integral stack 10 through the second electrically conductive adhesive layer 500.

For example, the flexible metal film 700 may include one or more of copper, metal plated copper, nickel plated copper, nickel alloy plated copper, tin plated copper, gold plated copper, nickel, a nickel alloy, and an electrically conductive multi-layer film. In addition, the nickel alloy of the flexible metal film 700 may include one or more of chromium, vanadium, and a titanium alloy.

In addition, the flexible metal film 700 may include a flexible material, and may be bent by an external force. For example, bending a first point 701 of the flexible metal film 700 over a bend radius of between 1 mm and 10 mm may cause a very small damage to the flexible metal film 700 at the first point 701 of the flexible metal film 700 or may not cause a damage.

The third electrically conductive adhesive layer 800 may be disposed between the flexible metal film 700 and the second board 600, and may connect the flexible metal film 700 and the second board 600. The third electrically conductive adhesive layer 800 may form the second resistive contact with the second board 600. Herein, the second resistive contact refers to a resistance that is generated by contact between the second board 600 and the third electrically conductive adhesive layer 800. For example, a second passive intermodulation signal may be generated by the second resistive contact formed between the third electrically conductive adhesive layer 800 and the second board 600.

Meanwhile, the first electrically conductive adhesive layer 400, the second electrically conductive adhesive layer 500, and the third electrically conductive adhesive layer 800 may include electrically conductive elements 410, 510, 810 and electrically insulative materials 420, 520, 820, respectively.

A plurality of electrically conductive elements 410, 510, 810 may be provided, and the plurality of electrically conductive elements 410, 510, 810 may be distributed in the electrically insulative materials 420, 520, 820. For example, the electrically conductive elements 410, 510, 810 may include one or more of electrically conductive particles and electrically conductive fibers. The electrically conductive particles of the electrically conductive elements 410, 510, 810 may include insulative particles coated with one or more conductive paints. In addition, the electrically conductive fibers of the electrically conductive elements 410, 510, 810 may include insulative particles coated with one or more conductive paints.

The first electrically conductive adhesive layer 400, the second electrically conductive adhesive layer 500, and the third electrically conductive adhesive layer 800 may have electrical conductivity due to the plurality of electrically conductive elements 410, 510, 810. In addition, the first electrically conductive adhesive layer 400, the second electrically conductive adhesive layer 500, and the third electrically conductive adhesive layer 800 may have electrical conductivity in the thickness direction that is greater than electrical conductivity in the lateral direction. In other words, the first electrically conductive adhesive layer 400, the second electrically conductive adhesive layer 500, and the third electrically conductive adhesive layer 800 may allow a current to flow better in the thickness direction than in the lateral direction.

Figure 3:
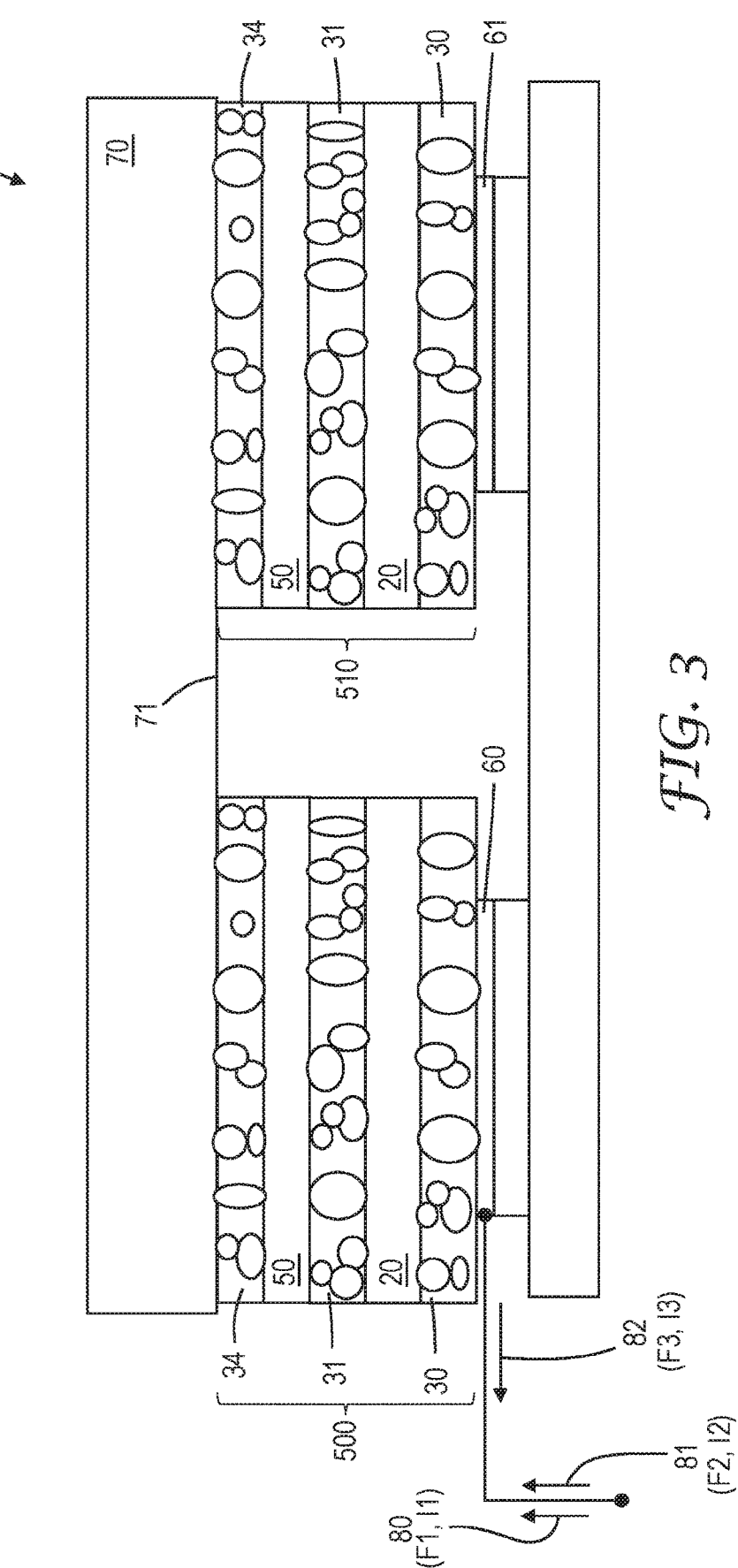
FIG. 3 is a cross-sectional view illustrating a process of manufacturing the integral electronic stack of FIG. 1.

In the present embodiment, it is illustrated that a second multi-layer stack 40 includes the second board 600, the flexible metal film 700, and the third electrically conductive adhesive layer 800, but this is merely an example, and the second multi-layer stack 40 may include only the second board 600 as shown in FIG. 3. For example, a first multi-layer stack 30 may include the first board 100, the first electrically conductive layer 200, the first electrically conductive film 300, the first electrically conductive adhesive layer 400, the second electrically conducive adhesive layer 500, the flexible metal film 700, and the third electrically conductive adhesive layer 800, and the second multi-layer stack 40 may include the second board 600.

Figure 4:
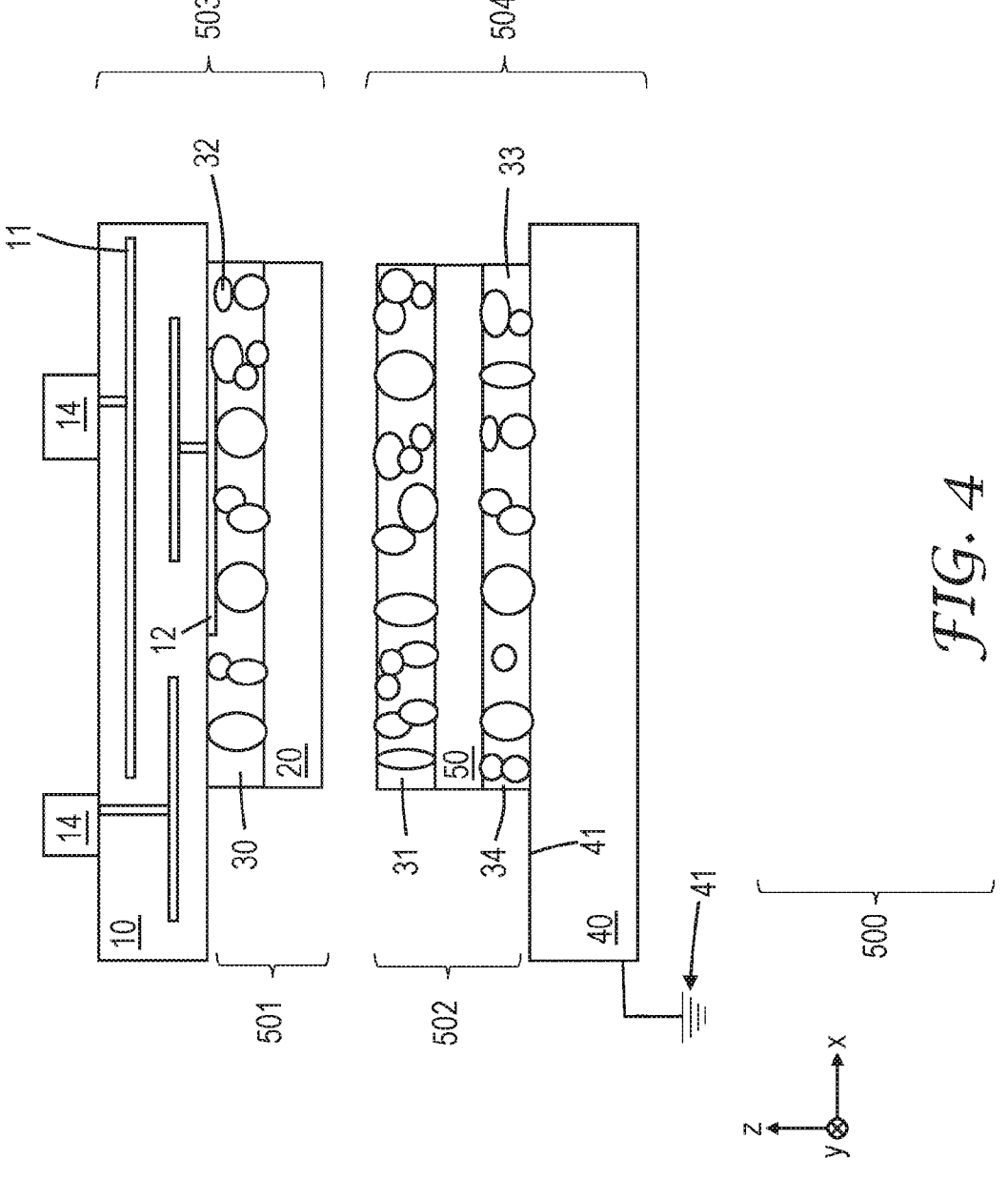
FIG. 4 is a cross-sectional view illustrating a cross section of an integral electronic stack according to a second embodiment of the disclosure.

In addition to the above-described configuration, an integral electronic stack 1 according to a second embodiment of the disclosure may include a first multi-layer stack 30, a second multi-layer stack 40, a gold microstrip 50, a first board 100, and a second board 600. Hereinafter, the second embodiment of the disclosure will be described by referring more to FIG. 4. In describing the second embodiment, differences from the above-described embodiment will be mainly described, and, regarding the same description and reference numerals, reference is made to the above-described embodiment.

Each of the first multi-layer stack 30 and the second multi-layer stack 40 may include a first electrically conductive film 300, a first electrically conductive adhesive layer 400, a second electrically conducive adhesive layer 500, a flexible metal film 700, and a third electrically conductive adhesive layer 800.

The first electrically conductive film 300 may be disposed between the second electrically conductive adhesive layer 500 and the third electrically conductive adhesive layer 800, and may be bonded to the second electrically conductive adhesive layer 500 and the third electrically conductive adhesive layer 800. The first electrically conductive film 300 may be referred to as a second electrically conductive film.

The first electrically conductive adhesive layer 400 may be disposed between the second board 600 and the flexible metal film 700, and may connect the second board 600 and the flexible metal film 700.

The second electrically conductive adhesive layer 500 may be disposed between the flexible metal film 700 and the first electrically conductive film 300, and may connect the flexible metal film 700 and the first electrically conductive film 300.

The flexible metal film 700 may be disposed between the first electrically conductive adhesive layer 400 and the second electrically conductive adhesive layer 500, and may be bonded to the first electrically conductive adhesive layer 400 and the second electrically conductive adhesive layer 500.

The third electrically conductive adhesive layer 800 may be disposed between the gold microstrip 50 and the first electrically conductive film 300, and may connect the gold microstrip 50 and the first electrically conductive film 300.

The first board 100 may connect a first gold microstrip 50 and a second gold microstrip 60.

The second board 600 may include stainless steel, and may be referred to as a stainless steel plate.

The gold microstrip 50 may include gold (Au), and may include the first gold microstrip 51 and the second gold microstrip 52.

The first gold microstrip 51 may be disposed between the first multi-layer stack 30 and the first board 100, and may connect the first multi-layer stack 30 and the first board 100. The first gold microstrip 51 may reduce passive intermodulation occurring between the first multi-layer stack 30 and the second board 600.

The second gold microstrip 52 may be disposed between the second multi-layer stack 40 and the first board 100, and may connect the second multi-layer stack 40 and the first board 100. The second gold microstrip 52 may reduce passive intermodulation occurring between the second multi-layer stack 40 and the second board 600.

Meanwhile, a conductive circuit may be provided to the integral electronic stack 1. For example, the conductive circuit may be provided by a step of arranging the first multi-layer stack 30 and the second multi-layer stack 40 between the gold microstrip 50 and the second board 600, such that the first electrically conductive adhesive layers 400 of the first multi-layer stack 30 and the second multi-layer stack 40 are bonded to the same surface of the second board 600, and the third electrically conductive adhesive layers 800 of the first multi-layer stack 30 and the second multi-layer stack 40 are bonded to the first gold microstrip 51 and the second gold microstrip 52. For example, the conductive circuit of the integral electronic stack 1 may be a predetermined circuit that allows a current to flow along the first board 100, the first metal microstrip 51, the first multi-layer stack 30, the second board 600, the second multi-layer stack 40, and the second gold microstrip 52.

When a first current signal and a second current signal are applied to the first gold microstrip 51 of the integral electronic stack 1, simultaneously, an intermodulation current signal may be reflected by an electric signal of strength I3. Herein, the first current signal may have a strength of I1 and a frequency of F1. In addition, the second current signal may have a strength of I2 and a frequency of F2. For example, F1 and F2 may be between about 0.4 GHz and 6 GHZ, and I1 and I2 may belong to 0% to 30% therebetween. In a more specific example, F1 and F2 may be between about 600 MHz and 800 MHZ, and may have a difference of between about 0 MHz and 100 MHz therebetween.

The intermodulation current signal may have the same frequency F3 as nF1+mF2 (m and n are positive or negative integers, not 0). For example, I3/I1 may be −150 dB to −30 dB inclusive.

Figure 5:
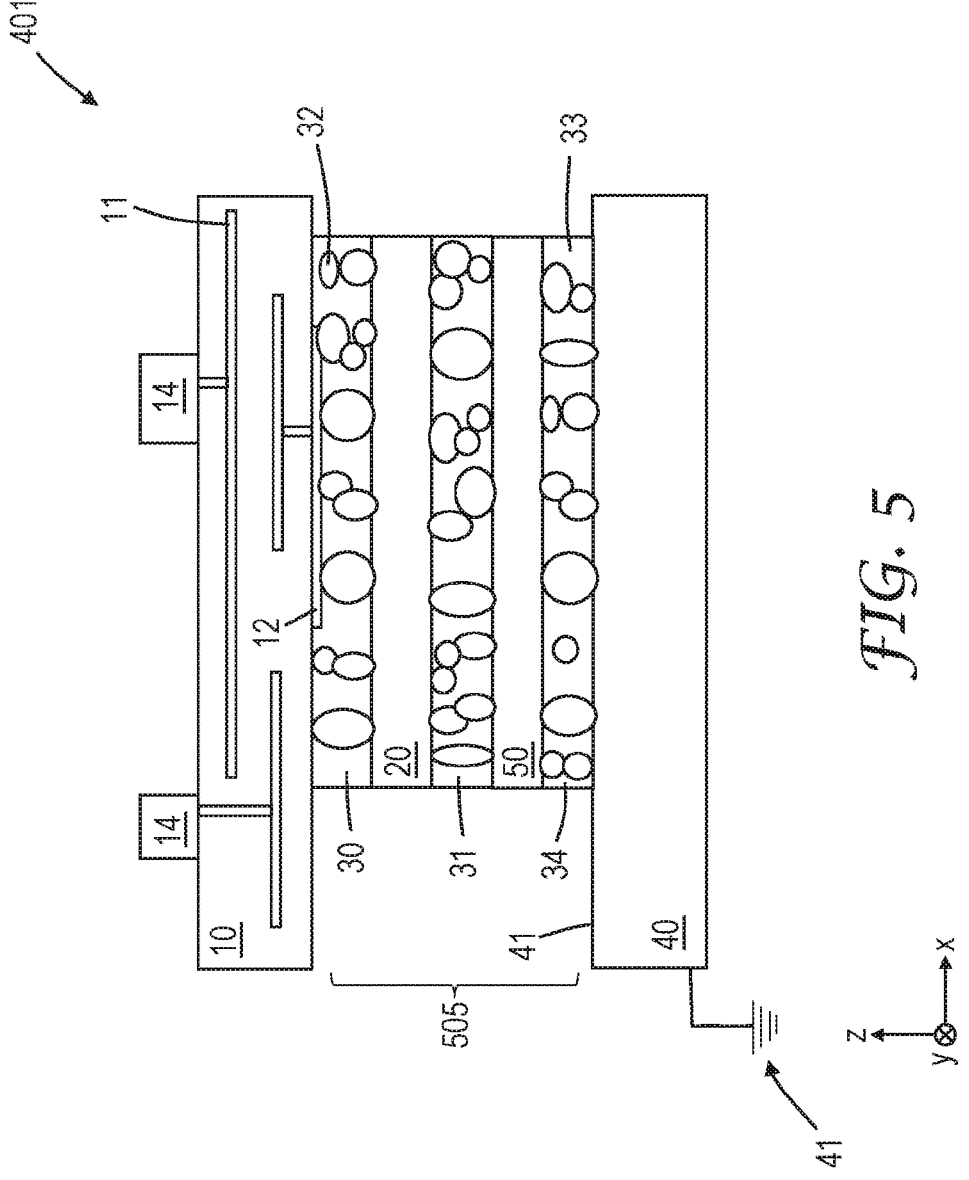
FIG. 5 is a cross-sectional view illustrating a cross section of an integral electronic stack according to a third embodiment of the present disclosure.
Figure 6:
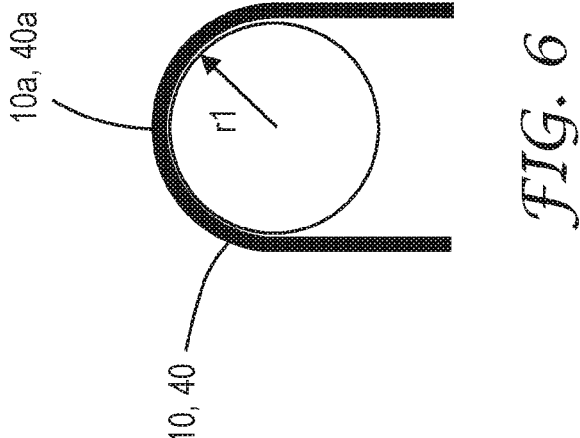
FIG. 6 is a cross-sectional view illustrating a cross section of an integral electronic stack according to a fourth embodiment of the disclosure.

In addition to the above-described configuration, an integral electronic stack 1 according to a third embodiment of the disclosure may include a first multi-layer stack 30, a second multi-layer stack 40, a first board 100 and a second board 600. Hereinafter, the third embodiment of the disclosure will be described by referring more to FIG. 5. In describing the third embodiment, differences from the above-described embodiments will be mainly described, and, regarding the same description and reference numerals, reference is made to the above-described embodiments.

Each of the first multi-layer stack 30 and the second multi-layer stack 40 may include a first electrically conductive film 300, a first electrically conductive adhesive layer 400, a second electrically conducive adhesive layer 500, a flexible metal film 700, and a third electrically conductive adhesive layer 800.

In the present embodiment, the first electrically conductive film 300 and the flexible metal film 700 may be referred to as a first electrically conductive flexible layer 900. In addition, the first electrically conductive adhesive layer 400, the second electrically conductive adhesive layer 500, and the third electrically conductive adhesive layer 800 may be referred to as a second electrically conductive flexible layer 1000.

For example, each of the first multi-layer stack 30 and the second multi-layer stack 40 may include a plurality of first electrically conductive flexible layer 900 and a plurality of second electrically conductive flexible layer 1000 which alternate with each other. The first electrically conductive flexible layer 900 may be a metal layer. In addition, the second electrically conductive flexible layer 1000 may be an adhesive layer that includes a plurality of electrically conductive elements substantially distributed in an electrically insulative material.

Meanwhile, a first circuit may be formed in the first multi-layer stack 30. For example, the first circuit may be formed by arranging the first multi-layer stack 30 between the first board 100 and the second board 600 so as to bond the first multi-layer stack 30 to the first board 100 and the second board 600.

In addition, a second circuit may be formed in the second multi-layer stack 40. For example, the second circuit may be formed through a step of providing a first partial multi-layer stack 41 and a second partial multi-layer stack 42, forming a first partial second circuit by bonding the provided first partial multi-layer stack 41 to the first board 100, and forming a second partial second circuit by bonding the second partial multi-layer stack 42 to the second board 600. In a more specific example, the second circuit may be formed by bonding the first partial second circuit and the second partial second circuit to each other so as to arrange the second multi-layer stack 40 between the first board 100 and the second board 600.

Herein, the first partial multi-layer stack 41 may include some of a plurality of layers of the first multi-layer stack 30, and the second partial multi-layer stack 42 may include some of the others of the plurality of layers of the first multi-layer stack 30. For example, the first partial multi-layer stack 41 may include the first electrically conductive adhesive layer 400, the first electrically conductive film 300, and the second electrically conductive adhesive layer 500. In addition, the second partial multi-layer stack 42 may include the flexible metal film 700 and the third electrically conductive adhesive layer 800. In another example, the first partial multi-layer stack 41 may include any one of the two second electrically conductive flexible layers 1000, and the plurality of first electrically conductive flexible layers 900 which are disposed between the two second electrically conductive flexible layers 1000. In addition, the second partial multi-layer stack 42 may include any one of the plurality of first electrically conductive flexible layers 900 and any one of the plurality of second electrically conductive flexible layers 1000.

The first multi-layer stack 30 and the second multi-layer stack 40 may be substantially similar to each other, and may have the same layer order from the first board 100 to the second board 600. In addition, the second board 600 of the first circuit and the second circuit may generate passive intermodulation signals I1 and I2, respectively, I1 may be smaller than I2 by between 3 dB and 80 dB.

In the present embodiment, the first multi-layer stack 30 and the second multi-layer stack 40 may be referred to as an integral first multi-layer stack 30 and an integral second multi-layer stack 40, respectively. In addition, the first partial multi-layer stack 41 and the second partial multi-layer stack 42 may be referred to as an integral first partial multi-layer stack 41 and an integral second partial multi-layer stack 42, respectively.

In addition to the above-described configuration, an integral electronic stack 1 according to a fourth embodiment of the disclosure may include a first board 100, a first electrically conductive layer 200, a first electrically conductive film 300, a first electrically conductive adhesive layer 400, a second electrically conducive adhesive layer 500, a second board 600, a flexible metal film 700, a third electrically conductive adhesive layer 800, and a fourth electrically conductive adhesive layer 1100. Hereinafter, the fourth embodiment of the present disclosure will be described by referring more to FIG. 6. In describing the fourth embodiment, differences from the above-described embodiments will be mainly described, and, regarding the same description and reference numerals, reference is made to the above-described embodiments.

A plurality of first electrical conductive film 300 may be provided. Some of the plurality of first electrically conductive films 300 may be disposed between the first electrically conductive adhesive layer 400 and the second electrically conductive adhesive layer 500. Some of the others of the plurality of first electrically conductive films 300 may be disposed between the third electrically conductive adhesive layer 800 and the fourth electrically conductive adhesive layer 1100.

The second electrically conductive adhesive layer 500 may connect some of the plurality of first electrically conductive films 300 to the flexible metal film 700.

The third electrically conductive adhesive layer 800 may connect some of the others of the plurality of first electrically conductive films 300 to the flexible metal film 700.

The fourth electrically conductive adhesive layer 1100 may be disposed between some of the others of the plurality of first electrically conductive films 300, and the second board 600, and may connect some of the others of the plurality of first electrically conductive films 300 to the second board 600.

The following is a list of embodiments of present disclosure.

Item 1 relates to an integral electronic stack for grounding an electrically conductive component in which passive intermodulation (PIM) is reduced, wherein the integral electronic stack includes a first integral stack and a second integral stack, the first integral stack being bonded to the second integral stack, wherein the first integral stack includes: a first board which is substantially rigid: a first electrically conductive layer which is disposed on at least part of a first main surface of the first board: a first electrically conductive adhesive layer and a second electrically conductive adhesive layer; and a first electrically conductive film which is disposed between the first electrically conductive adhesive layer and the second electrically conductive adhesive layer, and is bonded to the first electrically conductive adhesive layer and the second electrically conductive adhesive layer, respectively, the first electrically conductive adhesive layer and the second electrically conductive adhesive layer including a plurality of electrically conductive elements substantially distributed in an electrically insulative material, wherein the first electrically conductive adhesive layer bonds the first electrically conductive film to the one or more first electrically conductive layers, wherein the second integral stack includes: an electrically conductive second board which is substantially rigid: a third electrically conductive adhesive layer which includes a plurality of electrically conductive elements substantially distributed in an electrically insulative material; and a flexible metal film which is bonded to at least part of a first main surface of the second board through the third electrically conducive adhesive layer, wherein the first integral stack and the second integral stack are bonded to each other by the second electrically conductive adhesive layer which is bonded to the flexible metal film disposed opposite the third electrically conductive adhesive layer, and electrically connect the first electrically conductive layer to the second board.

Item 2 relates to the integral electronic stack, wherein the first board includes a first circuit board including one or more electrically conductive connectors.

Item 3 relates to the integral electronic stack, wherein the first board further includes one or more electronic devices which are coupled to a second main surface of the first board which is opposite to the first main surface of the first board, and wherein the one or more electronic devices are electrically connected to the one or more electrically conductive connectors.

Item 4 relates to the integral electronic stack, wherein the first electrically conductive layer includes one or more of gold (Au), tin (Sn), nickel (Ni), silver (Ag), and silver ink.

Item 5 relates to the integral electronic stack, wherein the first electrically conductive film includes one or more of an electrically conductive foil and an electrically conductive fabric.

Item 6 relates to the integral electronic stack, wherein the electrically conductive foil includes copper (Cu).

Item 7 relates to the integral electronic stack, wherein the electrically conductive fabric includes a plurality of woven electrically conductive fibers.

Item 8 relates to the integral electronic stack, wherein the electrically conductive fabric includes a plurality of non-woven electrically conductive fibers.

Item 9 relates to the integral electronic stack, wherein the second board includes one or more of stainless steel, aluminum (Al), galvanized aluminum, magnesium (Mg), an alloy of magnesium and aluminum, iron (Fe), zinc (Zn), galvanized steel, titanium (Ti), and zinc plated iron.

Item 10 relates to the integral electronic stack, wherein the flexible metal film includes one or more of copper, metal plated copper, nickel plated copper, nickel alloy plated copper, tin plated copper, gold plated copper, nickel, a nickel alloy, and an electrically conductive multi-layer film.

Item 11 relates to the integral electronic stack, wherein the nickel alloy includes one or more of chromium, vanadium, and a titanium alloy.

Item 12 relates to the integral electronic stack, wherein the first electrically conductive adhesive layer forms a first resistive contact with the first electrically conductive layer, and the third electrically conductive adhesive layer forms a second resistive contact with the second board, and wherein the presence of the flexible metal film reduces a passive intermodulation signal generated in one or more of the first resistive contact and the second resistive contact by 5 dB to 80 dB inclusive.

Item 13 relates to the integral electronic stack, wherein the second board is grounded and grounds the first board.

Item 14 relates to the integral electronic stack, wherein a passive intermodulation signal generated in the integral electronic stack is mainly caused by any one of the first board and the second board.

Item 15 relates to the integral electronic stack, wherein the passive intermodulation signal generated in the electronic stack is mainly caused by the second board.

Item 16 relates to the integral electronic stack, wherein the plurality of electrically conductive elements of one or more of the first electrically conductive adhesive layer, the second electrically conductive adhesive layer, and the third electrically conductive adhesive layer include one or more of electrically conductive particles and electrically conductive fibers.

Item 17 relates to the integral electronic stack, wherein the electrically conductive particles include insulative particles which are coated with one or more conductive paints.

Item 18 relates to the integral electronic stack, wherein the electrically conductive fibers include insulative particles which are coated with one or more conductive paints.

Item 19 relates to the integral electronic stack, wherein one or more of the first electrically conductive adhesive layer, the second electrically conductive adhesive layer, and the third electrically conductive adhesive layer are more conductive along a thickness direction of the adhesive layer, and are less conductive along a lateral direction which is orthogonal to the thickness direction of the adhesive layer.

Item 20 relates to the integral electronic stack, wherein the first electrically conductive layer is disposed only on a part of the first main surface of the first circuit board.

Item 21 relates to the integral electronic stack, wherein bending a first point of each of the first board and the second board which are substantially rigid over a bend radius of between 1 mm and 10 mm deforms the rigid board at the first point irreversibly.

Item 22 relates to the integral electronic stack, wherein bending a first point of the flexible metal film over a bend radius of between 1 mm and 10 mm causes a very small damage to the flexible metal film at the first point, or does not cause a damage.

Item 23 relates to an integral electronic stack including: a first electrically conductive adhesive layer, a second electrically conductive adhesive layer, a third electrically conductive adhesive layer; a flexible metal film which is disposed between the first electrically conductive adhesive layer and the second electrically conductive adhesive layer, and is bonded to the first electrically conductive adhesive layer and the second electrically conductive adhesive layer; and a second electrically conductive film which is disposed between the second electrically conductive adhesive layer and the third electrically conductive adhesive layer, and is bonded to the second electrically conductive adhesive layer and the third electrically conductive adhesive layer, wherein each of the first to third electrically conductive adhesive layers includes a plurality of electrically conductive elements substantially distributed in an electrically insulative material, wherein, when a conductive circuit is provided by the steps of: providing a first gold microstrip and a second gold microstrip which are spaced apart from each other: arranging a same stainless steel plate on the first gold microstrip and the second gold microstrip; and arranging a multi-layer stack and a multi-layer stack which is substantially similar to the multi-layer stack between the stainless steel plate and the first gold microstrip, and the second gold microstrip, such that the first electrically conductive adhesive layers of the two multi-layer stacks are bonded to the same surface of the stainless steel plate, and the third electrically conductive adhesive layers of the two multi-layer stacks are bonded to the first gold microstrip and the second gold microstrip, respectively, if a first current signal and a second current signal which have strengths I1 and I2, respectively, which are substantially the same, and frequencies F1 and F2 which are different, are applied to the first gold microstrip, simultaneously, an intermodulation current signal that has a same frequency F3 as nF1+mF2 (m and n are positive or negative integers, not 0) is reflected by an electrical signal of strength I3, −150≤I3/I1≤−30 dB.

Item 24 relates to the integral electronic stack, wherein the flexible metal film includes one or more of an electrically conductive foil and an electrically conductive fabric.

Item 25 relates to the integral electronic stack, wherein the electrically conductive foil includes copper.

Item 26 relates to the integral electronic stack, wherein the electrically conductive fabric includes a plurality of woven electrically conductive fibers.

Item 27 relates to the integral electronic stack, wherein the electrically conductive fabric includes a plurality of non-woven electrically conductive fibers.

Item 28 relates to the integral electronic stack, wherein the plurality of electrically conductive elements of one or more of the first electrically conductive adhesive layer, the second electrically conductive adhesive layer, and the third electrically conductive adhesive layer include one or more of electrically conductive particles and electrically conductive fibers.

Item 29 relates to the integral electronic stack, wherein one or more of the first electrically conductive adhesive layer, the second electrically conductive adhesive layer, and the third electrically conductive adhesive layer are more conductive along a thickness direction of the adhesive layer, and are less conductive along a lateral direction which is orthogonal to the thickness direction of the adhesive layer.

Item 30 relates to the integral electronic stack, wherein the flexible metal film includes one or more of copper, metal plated copper, nickel plated copper, nickel alloy plated copper, tin plated copper, gold plated copper, nickel, a nickel alloy, and an electrically conductive multi-layer film.

Item 31 relates to the integral electronic stack, wherein the nickel alloy includes one or more of chromium, vanadium, and a titanium alloy.

Item 32 relates to the integral electronic stack, wherein the strengths I1 and I2 belong to 0% to 10% therebetween.

Item 33 relates to the integral electronic stack, wherein the F1 and F2 are between about 0.4 GHz and 6 GHz.

Item 34 relates to the integral electronic stack, wherein the F1 and F2 are between about 600 MHz and 4 GHz.

Item 35 relates to the integral electronic stack, wherein the F1 and F2 are between about 600 MHz and 800 MHZ.

Item 36 relates to the integral electronic stack, wherein the F1 and F2 have a difference of between about 0 MHz and 100 MHz.

Item 37 relates to the integral electronic stack, wherein any one of the m and the n is a positive integer, and the other one of the m and the n is a negative integer.

Item 38 relates to an integral electronic stack including a plurality of first electrically conductive flexible layer and a plurality of second electrically conductive flexible layer which alternate with each other, wherein the one or more first electrically conductive flexible layers are metal layers, and each of the plurality of second electrically conductive flexible layers is an adhesive layer that includes a plurality of electrically conductive elements substantially distributed in an electrically insulative material, wherein an electrically grounded first circuit is formed by arranging an integral first multi-layer stack between a first board and a second board, the first board being substantially rigid such that the integral first multi-layer stack is bonded to the first board and the second board, respectively, the second board being electrically grounded and being substantially rigid, wherein an electrically grounded second circuit is formed by the steps of: providing an integral first partial multi-layer stack including only some of a plurality of layers of the integral first multi-layer stack, and an integral second partial multi-layer stack including some of the others of the plurality of layers of the integral first multi-layer stack: forming a first partial second circuit by bonding the integral first partial multi-layer stack to the first board, and forming a second partial second circuit by bonding the integral second partial multi-layer stack to the second board; and forming a second circuit by bonding the first partial second circuit and the second partial second circuit to each other, such that the integral second multi-layer stack is disposed between the first board and the second board, wherein the integral first multi-layer stack and the integral second multi-layer stack are substantially similar to each other, and have a same layer order from the first board to the second board, and wherein the second boards of the first circuit and the second circuit generate passive intermodulation signals I1 and I2, respectively, and the I1 is smaller than the I2 by between 5 dB and 80 dB.

Item 39 relates to the integral electronic stack, wherein the metal layer includes one or more of copper, metal plated copper, nickel plated copper, nickel alloy plated copper, tin plated copper, gold plated copper, nickel, a nickel alloy, and an electrically conductive multi-layer film.

Item 40 relates to the integral electronic stack, wherein the one or more first electrically conductive flexible layers include one or more of an electrically conductive foil and an electrically conductive fabric.

Item 41 relates to the integral electronic stack, wherein the electrically conductive foil includes copper.

Item 42 relates to the integral electronic stack, wherein the electrically conductive fabric includes a plurality of woven electrically conductive fibers.

Item 43 relates to the integral electronic stack, wherein the electrically conductive fabric includes a plurality of non-woven electrically conductive fibers.

Item 44 relates to the integral electronic stack, wherein the first board includes a first circuit board including one or more electrically conductive connectors.

Item 45 relates to the integral electronic stack, further including one or more electronic devices which are coupled to a second main surface of the first board which is disposed opposite a first main surface of the first board, wherein the one or more electronic devices are electrically connected to the one or more electrically conductive connectors.

Item 46 relates to the integral electronic stack, wherein the second board includes one or more of stainless steel, aluminum, galvanized aluminum, magnesium, an alloy of magnesium and aluminum, iron, zinc, galvanized steel, titanium, and zinc plated iron.

Item 47 relates to the integral electronic stack, wherein bending a first point of each of the first board and the second board which are substantially rigid over a bend radius of between 1 mm and 10 mm deforms the rigid board at the first point irreversibly.

Item 48 relates to the integral electronic stack, wherein some layers of the integral electronic stack include any one of the plurality of first electrically conductive flexible layers disposed between the two second electrically conductive flexible layers.

Item 49 relates to the integral electronic stack, wherein some of the other layers of the integral electronic stack include any one of the plurality of first electrically conductive flexible layers, and any one of the plurality of second electrically conductive flexible layers.

Although embodiments of the disclosure have been described in the form of specific embodiments, these are merely examples and the disclosure is not limited thereto, and should be interpreted as having the widest scope of the technical concept disclosed in the specification. An ordinary skilled person in the related art may embody a pattern of a shape that is not set forth herein by combining/substituting the disclosed embodiments, without departing from the scope of the disclosure. In addition, an ordinary skilled person in the related art may easily change or modify the disclosed embodiments based on the detailed descriptions, and it is obvious that the changes or modifications belong to the right scope of the disclosure.

DESCRIPTION OF REFERENCE NUMERALS

1: Integral electronic stack
10: First integral stack
20: Second integral stack
30: First multi-layer stack
40: Second multi-layer stack
41: First partial multi-layer stack
42: Second partial multi-layer stack
50: Gold microstrip
51: First gold microstrip
52: Second gold microstrip
100: First board
200: First electrically conductive layer
300: First electrically conductive film
400: First electrically conductive adhesive layer
500: Second electrically conductive adhesive layer
600: Second board
700: Flexible metal film
800: Third electrically conductive adhesive layer
900: First electrically conductive flexible layer
1000: Second electrically conductive flexible layer
1100: Fourth electrically conductive adhesive layer

What is claimed is:

1. An integral electronic stack for grounding an electrically conductive component in which passive intermodulation (PIM) is reduced,
wherein the integral electronic stack comprises a first integral stack and a second integral stack, the first integral stack being bonded to the second integral stack,
wherein the first integral stack comprises:
a first board which is substantially rigid:
a first electrically conductive layer which is disposed on at least part of a first main surface of the first board;
a first electrically conductive adhesive layer and a second electrically conductive adhesive layer; and
a first electrically conductive film which is disposed between the first electrically conductive adhesive layer and the second electrically conductive adhesive layer, and is bonded to the first electrically conductive adhesive layer and the second electrically conductive adhesive layer, respectively, the first electrically conductive adhesive layer and the second electrically conductive adhesive layer comprising a plurality of electrically conductive elements substantially distributed in an electrically insulative material,
wherein the first electrically conductive adhesive layer bonds the first electrically conductive film to the one or more first electrically conductive layers,
wherein the second integral stack comprises:
an electrically conductive second board which is substantially rigid:

a third electrically conductive adhesive layer which comprises a plurality of electrically conductive elements substantially distributed in an electrically insulative material; and
a flexible metal film which is bonded to at least part of a first main surface of the second board through the third electrically conducive adhesive layer,
wherein the first integral stack and the second integral stack are bonded to each other by the second electrically conductive adhesive layer which is bonded to the flexible metal film disposed opposite the third electrically conductive adhesive layer, and electrically connect the first electrically conductive layer to the second board.

2. The integral electronic stack of claim 1,
wherein the second board comprises one or more of stainless steel, aluminum (Al), galvanized aluminum, magnesium (Mg), an alloy of magnesium and aluminum, iron (Fe), zinc (Zn), galvanized steel, titanium (Ti), and zinc plated iron.

3. The integral electronic stack of claim 1,
wherein the first electrically conductive adhesive layer forms a first resistive contact with the first electrically conductive layer, and the third electrically conductive adhesive layer forms a second resistive contact with the second board, and
wherein the presence of the flexible metal film reduces a passive intermodulation signal generated in one or more of the first resistive contact and the second resistive contact by 5 dB to 80 dB inclusive.

4. The integral electronic stack of claim 1,
wherein a passive intermodulation signal generated in the integral electronic stack is mainly caused by any one of the first board and the second board.

5. The integral electronic stack of claim 1,
wherein bending a first point of each of the first board and the second board which are substantially rigid over a bend radius of between 1 mm and 10 mm deforms the rigid board at the first point irreversibly.

6. An integral electronic stack comprising:
a first electrically conductive adhesive layer, a second electrically conductive adhesive layer, a third electrically conductive adhesive layer;
a flexible metal film which is disposed between the first electrically conductive adhesive layer and the second electrically conductive adhesive layer, and is bonded to the first electrically conductive adhesive layer and the second electrically conductive adhesive layer; and
a second electrically conductive film which is disposed between the second electrically conductive adhesive layer and the third electrically conductive adhesive layer, and is bonded to the second electrically conductive adhesive layer and the third electrically conductive adhesive layer,
wherein each of the first to third electrically conductive adhesive layers comprises a plurality of electrically conductive elements substantially distributed in an electrically insulative material,
wherein, when a conductive circuit is provided by the steps of:
providing a first gold microstrip and a second gold microstrip which are spaced apart from each other;
arranging a same stainless steel plate on the first gold microstrip and the second gold microstrip; and
arranging a multi-layer stack and a multi-layer stack which is substantially similar to the multi-layer stack between the stainless steel plate and the first gold microstrip, and the second gold microstrip, such that the first electrically conductive adhesive layers of the two multi-layer stacks are bonded to the same surface of the stainless steel plate, and the third electrically conductive adhesive layers of the two multi-layer stacks are bonded to the first gold microstrip and the second gold microstrip, respectively, if a first current signal and a second current signal which have strengths I1 and I2, respectively, which are substantially the same, and frequencies F1 and F2 which are different, are applied to the first gold microstrip, simultaneously, an intermodulation current signal that has a same frequency F3 as nF1+mF2 (m and n are positive or negative integers, not 0) is reflected by an electrical signal of strength I3, $-150 \le I3/I1 \le -30$ dB.

7. The integral electronic stack of claim 6, wherein the strengths I1 and I2 belong to 0% to 10% therebetween.

8. The integral electronic stack of claim 6, wherein the F1 and F2 are between about 0.4 GHz and 6 GHz.

9. An integral electronic stack comprising a plurality of first electrically conductive flexible layer and a plurality of second electrically conductive flexible layer which alternate with each other, wherein the one or more first electrically conductive flexible layers are metal layers, and each of the plurality of second electrically conductive flexible layers is an adhesive layer that comprises a plurality of electrically conductive elements substantially distributed in an electrically insulative material, wherein an electrically grounded first circuit is formed by arranging an integral first multi-layer stack between a first board and a second board, the first board being substantially rigid such that the integral first multi-layer stack is bonded to the first board and the second board, respectively, the second board being electrically grounded and being substantially rigid, wherein an electrically grounded second circuit is formed by the steps of:

providing an integral first partial multi-layer stack comprising only some of a plurality of layers of the integral first multi-layer stack, and an integral second partial multi-layer stack comprising some of the others of the plurality of layers of the integral first multi-layer stack:

forming a first partial second circuit by bonding the integral first partial multi-layer stack to the first board, and forming a second partial second circuit by bonding the integral second partial multi-layer stack to the second board; and forming a second circuit by bonding the first partial second circuit and the second partial second circuit to each other, such that the integral second multi-layer stack is disposed between the first board and the second board, wherein the integral first multi-layer stack and the integral second multi-layer stack are substantially similar to each other, and have a same layer order from the first board to the second board, and wherein the second boards of the first circuit and the second circuit generate passive intermodulation signals I1 and I2, respectively, and the I1 is smaller than the I2 by between 5 dB and 80 dB.

10. The integral electronic stack of claim 9, wherein some of the other layers of the integral first multi-layer stack comprise any one of the plurality of first electrically conductive flexible layers, and any one of the plurality of second electrically conductive flexible layers.

* * * * *